(12) United States Patent
Lin et al.

(10) Patent No.: US 8,477,511 B2
(45) Date of Patent: Jul. 2, 2013

(54) PACKAGE STRUCTURE AND ELECTRONIC APPARATUS OF THE SAME

(75) Inventors: Ho-Shyan Lin, Taipei (TW); Tsu-Yang Wong, Hsinchu (TW)

(73) Assignee: Amazing Microelectronic Corp., Taipei County (TW)

( * ) Notice: Subject to any disclaimer, the term of this patent is extended or adjusted under 35 U.S.C. 154(b) by 231 days.

(21) Appl. No.: 12/874,806

(22) Filed: Sep. 2, 2010

(65) Prior Publication Data

US 2011/0214902 A1    Sep. 8, 2011

(30) Foreign Application Priority Data

Mar. 8, 2010   (TW) .............................. 99204040 U

(51) Int. Cl.
*H01R 9/00* (2006.01)

(52) U.S. Cl.
USPC ............ 361/772; 361/768; 361/774; 361/777

(58) Field of Classification Search
USPC ........... 361/767–777; 174/250–253, 259–260
See application file for complete search history.

(56) References Cited

U.S. PATENT DOCUMENTS

| | | | | |
|---|---|---|---|---|
| RE37,539 E | * | 2/2002 | Oguchi et al. | 257/686 |
| 6,369,447 B2 | * | 4/2002 | Mori | 257/777 |
| 6,603,071 B2 | * | 8/2003 | Takao | 174/538 |
| 7,732,539 B2 | * | 6/2010 | Shull et al. | 526/88 |
| 2004/0108594 A1 | * | 6/2004 | Toyosawa | 257/734 |
| 2004/0142499 A1 | * | 7/2004 | Farnworth et al. | 438/17 |
| 2008/0202800 A1 | * | 8/2008 | Kuo et al. | 174/257 |

\* cited by examiner

*Primary Examiner* — Tuan T Dinh
(74) *Attorney, Agent, or Firm* — Morris Manning & Martin LLP; Tim Tingkang Xia, Esq.

(57) ABSTRACT

A package structure and an electronic apparatus of the package structure are disclosed. The package structure includes a substrate and a plurality of pins. The plurality of pins is disposed on the substrate. The plurality of pins is interlaced to each other, so that a line along a specific direction will only pass one of the plurality of pins at most.

7 Claims, 5 Drawing Sheets

PACKAGE STRUCTURE AND ELECTRONIC APPARATUS OF THE SAME

CROSS-REFERENCE TO RELATED APPLICATION

This application claims the benefit of Taiwan Patent Application No. 099204040, filed on Mar. 8, 2010, which is hereby incorporated by reference for all purposes as if fully set forth herein.

BACKGROUND OF THE INVENTION

1. Field of the Invention

The invention relates to package. In particular, the invention relates to a package structure having interlaced pins and an electronic apparatus including such package structure could increase the minimum spacing between the adjacent pins to lower the difficulty of the package process. In addition, since the routing of the printed circuit board can directly penetrate the bottom of the package structure, therefore, the design of the printed circuit board will become simpler and easier. Especially, the circuits sensitive to loads or layout (e.g., a high-speed signal circuit) will be deeply affected.

2. Description of the Prior Art

In recent years, with the innovation and development of the electronic technology, various kinds of electronic apparatuses with different functions are shown on the market. In these electronic apparatuses, the printed circuit board and its package structure have very important applications. Please refer to FIG. 1A. FIG. 1A shows a scheme diagram of a package structure 1 of a printed circuit board 10 in a conventional electronic apparatus.

As shown in FIG. 1A, pins P1~P10 are disposed on the printed circuit board 10, wherein, the pins P1~P5 are disposed at a first side of the printed circuit board 10, and the pins P6~P10 are disposed at a second side of the printed circuit board 10, and the first side corresponds to the second side. It should be noticed that the pins P1~P5 disposed at the first side of the printed circuit board 10 and the pins P6~P10 disposed at the second side of the printed circuit board 10 are symmetrically aligned. Therefore, a straight line M in FIG. 1A will pass the pin P1 at the first side of the printed circuit board 10 and the pin P2 at the second side of the printed circuit board 10.

More specifically, the pin P1 at the first side of the printed circuit board 10 is opposite to the pin P2 at the second side; the pin P3 at the first side is opposite to the pin P4 at the second side; the pin P5 at the first side is opposite to the pin P6 at the second side; the pin P7 at the first side is opposite to the pin P8 at the second side; the pin P9 at the first side is opposite to the pin P10 at the second side.

Please refer to FIG. 1B. FIG. 1B shows a scheme diagram of the layout of the printed circuit board 10 in a conventional electronic apparatus shown in FIG. 1A. As shown in FIG. 1B, since the pins P1~P5 disposed at the first side of the printed circuit board 10 and the pins P6~P10 disposed at the second side of the printed circuit board 10 are symmetrically aligned, therefore, as to each pin disposed on the printed circuit board 10, the routing coupled to each pin respectively should be bended to dodge the opposite pin.

For example, the routing L1 coupled to the pin P1 must be bended to dodge the pin P2 opposite to the pin P1. Similarly, the routing L2 coupled to the pin P2 must also be bended to dodge the pin P1 opposite to the pin P2. And, the conditions of the routing L3 coupled to the pin P3 and the routing L4 coupled to the pin P4 are similar, so that it will not be described again here.

It should be noticed that when the package structure 1 of the printed circuit board 10 is designed, there will be a minimum spacing limitation between the adjacent package pins (e.g., between the pins P1 and P3, or between the pins P2 and P4). When the minimum spacing limitation becomes smaller and smaller, the entire package process will become more difficult. Moreover, since each pin disposed on the printed circuit board 10 must be bended to dodge the opposite pin, the routings of the printed circuit board 10 fail to penetrate the bottom of the package structure 1, therefore, it is quite inconvenient to the design of the printed circuit board 10 of the client end.

SUMMARY OF THE INVENTION

Therefore, a scope of the invention is to provide a package structure. A main feature of the package structure is the plurality of pins not symmetrically interlaced to solve the above-mentioned problems.

An embodiment according to the invention is a package structure. In this embodiment, the package structure includes a substrate and a plurality of pins. The plurality of pins is disposed on the substrate. The plurality of pins is interlaced to each other, so that a line along a specific direction will only pass one of the plurality of pins at most.

In practical applications, the plurality of pins can further include a plurality of first pins and a plurality of second pins. The plurality of first pins and the plurality of second pins are disposed at a first side and a second side of the substrate respectively. The plurality of first pins and the plurality of second pins are interlaced to each other.

In addition, the plurality of pins can further include a plurality of third pins, the plurality of third pins is disposed between the first side and the second side of the substrate, and the plurality of third pins, the plurality of first pins, and the plurality of second pins are also interlaced to each other. Or, the plurality of pins can further include a plurality of fourth pins and a plurality of fifth pins. The plurality of fourth pins and the plurality of fifth pins are disposed at a third side and a fourth side of the substrate respectively. The plurality of fourth pins and the plurality of fifth pins are also interlaced to each other. Wherein, the first side of the substrate is opposite to the second side, and the third side is opposite to the fourth side.

Another scope of the invention is to provide an electronic apparatus having a package structure. A main feature of the package structure is the plurality of pins not symmetrically interlaced.

Another embodiment according to the invention is an electronic apparatus. In this embodiment, the electronic apparatus includes a package structure. The package structure includes a substrate and a plurality of pins. The plurality of pins is disposed on the substrate. The plurality of pins is interlaced to each other, so that a line along a specific direction will only pass one of the plurality of pins at most.

In practical applications, the plurality of pins can further include a plurality of first pins and a plurality of second pins. The plurality of first pins and the plurality of second pins are disposed at a first side and a second side of the substrate respectively. The plurality of first pins and the plurality of second pins are interlaced to each other.

In addition, the plurality of pins can further include a plurality of third pins, the plurality of third pins is disposed between the first side and the second side of the substrate, and the plurality of third pins, the plurality of first pins, and the plurality of second pins are also interlaced to each other. Or, the plurality of pins can further include a plurality of fourth pins and a plurality of fifth pins. The plurality of fourth pins and the plurality of fifth pins are disposed at a third side and a fourth side of the substrate respectively. The plurality of fourth pins and the plurality of fifth pins are also interlaced to each other. Wherein, the first side of the substrate is opposite to the second side, and the third side is opposite to the fourth side.

Above all, a package structure having interlaced pins and an electronic apparatus including the package structure of the invention can increase the minimum spacing between the adjacent pins in the package structure to lower the difficulty of the package process. In addition, since the routing of the printed circuit board can directly penetrate the bottom of the package structure, therefore, the design of the printed circuit board will become simpler and easier. It should be noticed that the package structure and the electronic apparatus including the package structure of the invention can provide obvious improvement to the circuits sensitive to loads or layout (e.g., a high-speed signal circuit).

The advantage and spirit of the invention may be understood by the following recitations together with the appended drawings.

BRIEF DESCRIPTION OF THE APPENDED DRAWINGS

DETAILED DESCRIPTION OF THE INVENTION

The invention provides a package structure having interlaced pins and an electronic apparatus including the package structure. Since the package structure has interlaced pins, therefore, it can increase the minimum spacing between the adjacent pins in the package structure to lower the difficulty of the package process. In addition, since the routing of the printed circuit board can directly penetrate the bottom of the package structure, therefore, the design of the printed circuit board will become simpler and easier.

Figure 1A:
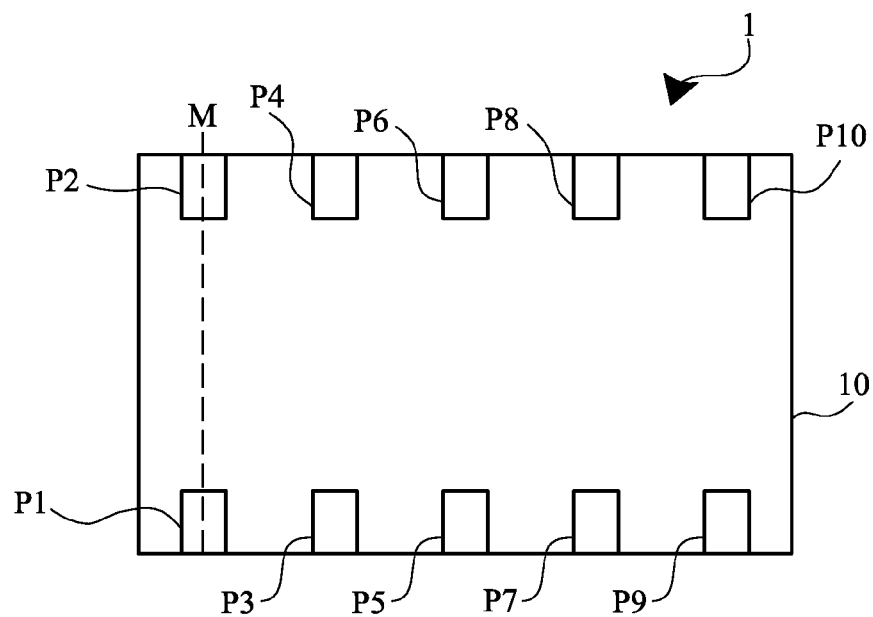
FIG. 1A shows a scheme diagram of the package structure of the printed circuit board in a conventional electronic apparatus.
Figure 1B:
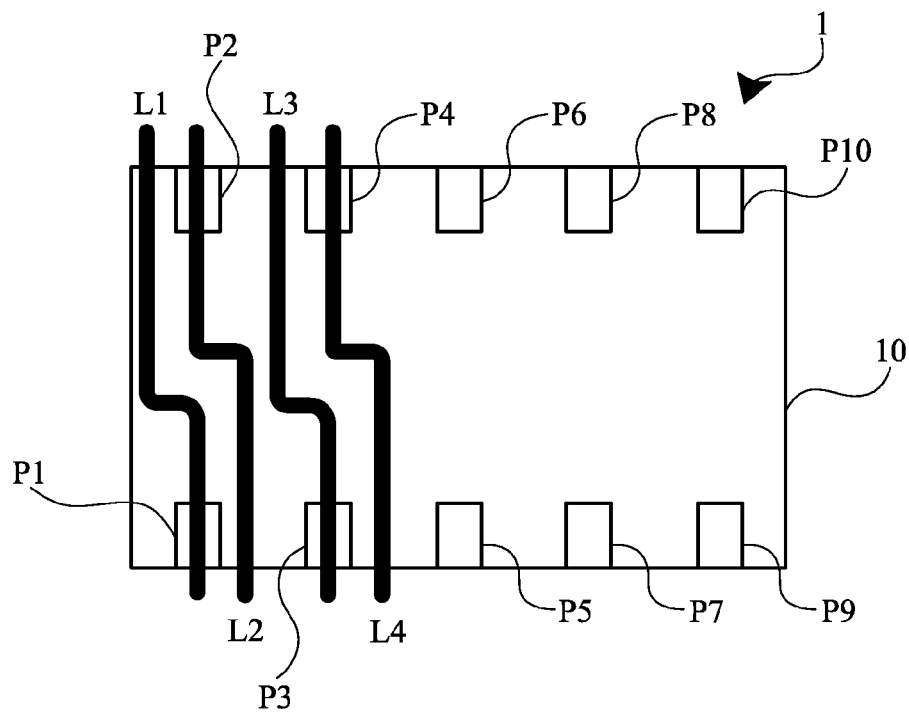
FIG. 1B shows a scheme diagram of the layout of the printed circuit board in a conventional electronic apparatus shown in FIG. 1A.

In practical applications, some circuits need a parallel line routing way (e.g., a high-speed differential line), if an ordinary chip package way is used, the routing ways shown in FIG. 1A and FIG. 1B must be selected. However, since two pins are used in the package of FIG. 1A, not only the pin resource is wasted but also the capacitance loading is increased. And, the bended routing of FIG. 1B also affects the signal quality, and the smaller size package fails to provide enough space to form the bended routing shown in FIG. 1B. The package structure having interlaced pins and the electronic apparatus including the package structure disclosed by the invention can easily resolve the above-mentioned problems.

In general, the pin position of the chip is decided by the minimum pin distance of the package process and the minimum spacing between two adjacent routings on the circuit board. Therefore, the chip package design must take care both of them at the same time. Since the interlaced pin design is used in the invention, therefore, when the minimum pin distance of the package process is larger than the minimum spacing between two adjacent routings on the circuit board, the minimum pin distance of the package process will be no longer a problem hard to overcome in package design.

Figure 2A:
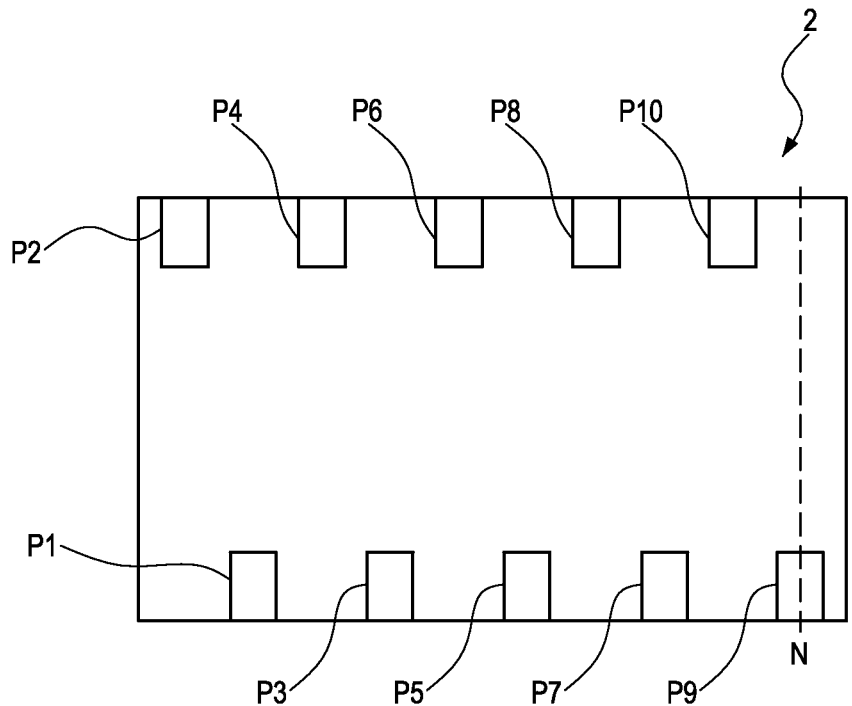
FIG. 2A shows a scheme diagram of the package structure in a first embodiment of the invention.

A first embodiment of the invention is a package structure of the printed circuit board. Please refer to FIG. 2A. FIG. 2A shows a scheme diagram of the package structure. As shown in FIG. 2A, the package structure 2 includes a substrate 20 and pins P1~P10. The pins P1~P10 are disposed on the substrate 20. The pins P1~P10 are interlaced to each other, so that a straight line along a specific direction (namely the direction vertical to the two sides of the pin disposed on the substrate 20, but not limited to this) will only pass one of the pins P1~P10 at most. That is to say, among the pins P1~P10, no any two pins will be disposed at the same straight line along the specific direction. For example, the straight line N in FIG. 2A will only pass the pin P9 of the pins P1~P10 instead of passing other pins.

Figure 2B:
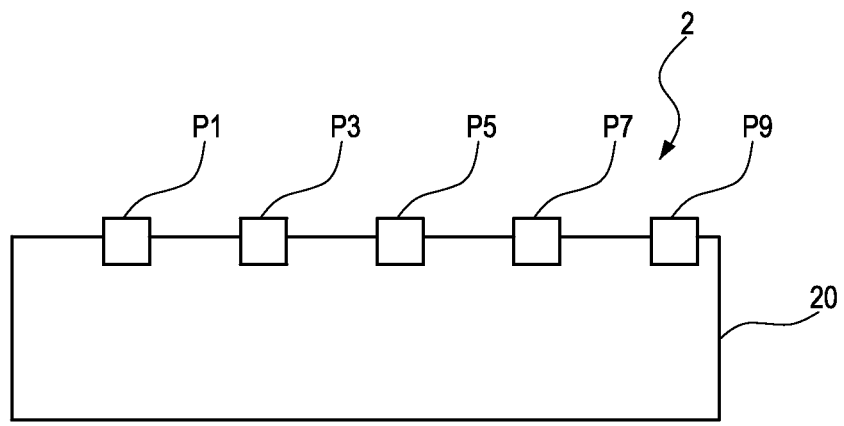
FIG. 2B shows a side view of the package structure shown in FIG. 2A.

More specifically, as shown in FIG. 2A, the pins P1, P3, P5, P7, and P9 in the package structure 2 are disposed at a first side of the substrate 20, and the pins P2, P4, P6, P8, and P10 are disposed at a second side of the substrate 20. The second side of the substrate 20 is opposite to the first side of the substrate 20. Wherein, the pins P1, P3, P5, P7, and P9 at the first side and the pins P2, P4, P6, P8, and P10 at the second side are interlaced to each other. That is to say, the pin P1 is opposite to the spacing between the pins P2 and P4; the pin P4 is opposite to the spacing between the pins P1 and P3; the pin P3 is opposite to the spacing between the pins P4 and P6, and so on. FIG. 2B shows a side view of the package structure 2.

Figure 3:
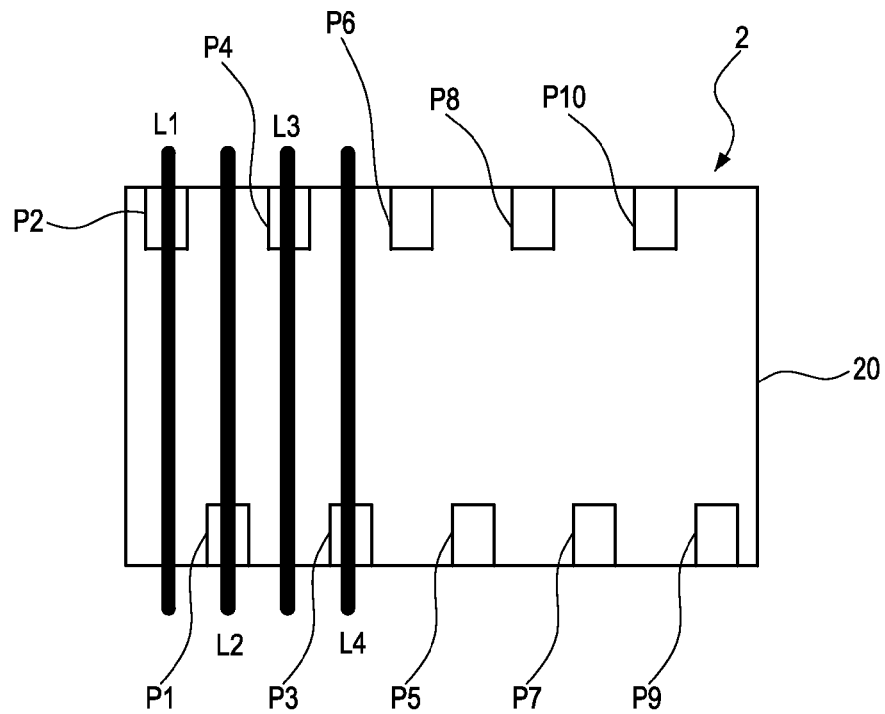
FIG. 3 shows a scheme diagram of the layout in the package structure shown in FIG. 2A.

Please refer to FIG. 3. FIG. 3 shows a scheme diagram of the layout in the package structure 2 shown in FIG. 2A. As shown in FIG. 3, the routing L1 of the printed circuit board is coupled to the pin P2 at the second side of the substrate 20; the routing L2 is coupled to the pin P1 at the first side of the substrate 20; the routing L3 is coupled to the pin P4 at the second side of the substrate 20; the routing L4 is coupled to the pin P3 at the first side of the substrate 20, and so on. By dosing so, when the routing of the printed circuit board is coupled to any pin on the substrate 20, the routing can smoothly dodge the opposite pin without being bended, that is to say, the routings can directly penetrate the bottom of the package structure 2 to make the entire printed circuit board design become easier and more convenient.

Figure 4:
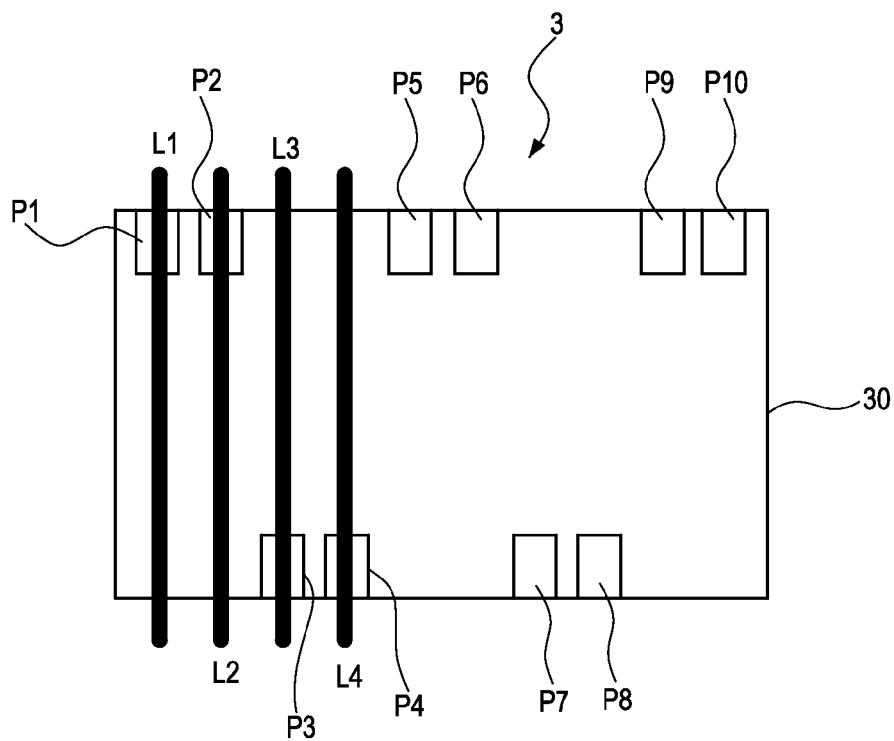
FIG. 4 shows a scheme diagram of another pin interlacing way in the package structure of the invention.

Please refer to FIG. 4. FIG. 4 shows a scheme diagram of another pin interlacing way in the package structure of the invention. As shown in FIG. 4, the pins P3, P4, P7, and P8 of the package structure 3 are disposed at a first side of the substrate 30, the pins P1, P2, P5, P6, P9, and P10 are disposed at a second side opposite to the first side of the substrate 30.

Wherein, two of the pins P3, P4, P7, and P8 at the first side and the pins P1, P2, P5, P6, P9, and P10 at the second side are interlaced.

That is to say, the pins P3 and P4 at the first side are opposite to the spacing between the pins P2 and P5 at the second side; the pins P5 and P6 at the second side are opposite to the spacing between the pins P4 and P7 at the first side, and so on. Therefore, a straight line along a specific direction (namely the direction vertical to the two sides of the pin disposed on the substrate 30, but not limited to this) will only pass one of the pins P1~P10 at most. That is to say, among the pins P1~P10, no any two pins will be disposed at the same straight line along the specific direction.

As shown in FIG. 4, the routing L1 of the printed circuit board is coupled to the pin P1 at the second side of the substrate 30; the routing L2 is couple to the pin P2 at the second side of the substrate 30; the routing L3 is couple to the pin P3 at the first side of the substrate 30; the routing L4 is couple to the pin P4 at the first side of the substrate 30, and so on. By doing so, when the routing of the printed circuit board is coupled to any pin on the substrate 30, the routing can smoothly dodge the opposite pin without being bended, that is to say, the routings can directly penetrate the bottom of the package structure 3 to make the entire printed circuit board design become easier and more convenient.

Figure 5:
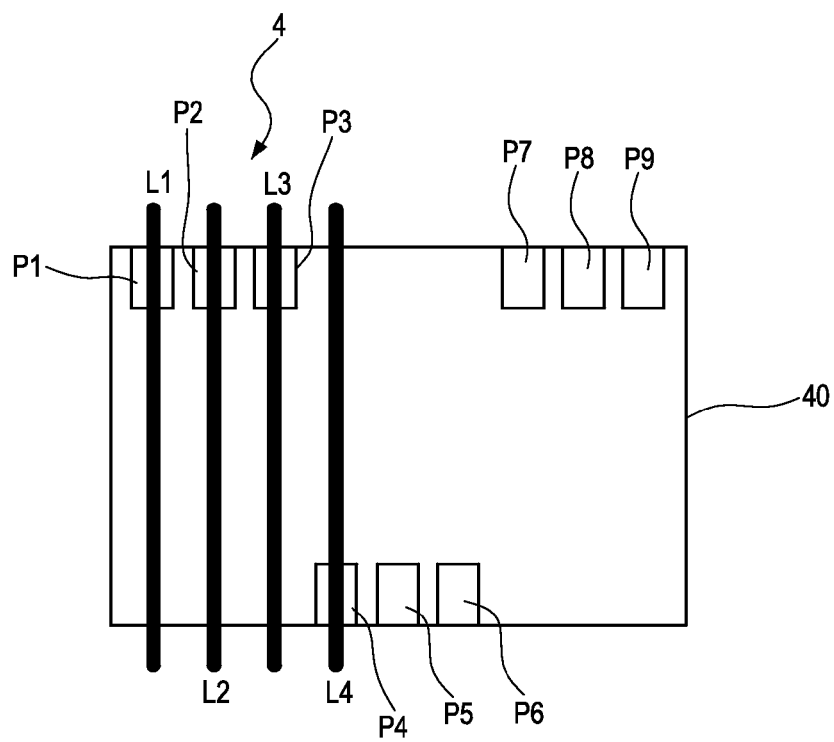
FIG. 5 shows a scheme diagram of another pin interlacing way in the package structure of the invention.

Please refer to FIG. 5. FIG. 5 shows a scheme diagram of another pin interlacing way in the package structure of the invention. As shown in FIG. 5, the pins P4, P5, and P6 of the package structure 4 are disposed at a first side of the substrate 40, the pins P1, P2, P3, P7, P8, and P9 are disposed at a second side opposite to the first side of the substrate 40. Wherein, every three of the pins P4, P5, and P6 at the first side and the pins P1, P2, P3, P7, P8, and P9 at the second side are interlaced. That is to say, the pins P4, P5, and P6 at the first side are opposite to the spacing between the pins P3 and P7 at the second side. Therefore, a straight line along a specific direction (namely the direction vertical to the two sides of the pin disposed on the substrate 40, but not limited to this) will only pass one of the pins P1~P9 at most. That is to say, among the pins P1~P9, no any two pins will be disposed at the same straight line along the specific direction.

As shown in FIG. 5, the routing L1 of the printed circuit board is coupled to the pin P1 at the second side of the substrate 40; the routing L2 is coupled to the pin P2 at the second side of the substrate 40; the routing L3 is coupled to the pin P3 at the second side of the substrate 40; the routing L4 is coupled to the pin P4 at the first side of the substrate 40, and so on.

Figure 6:
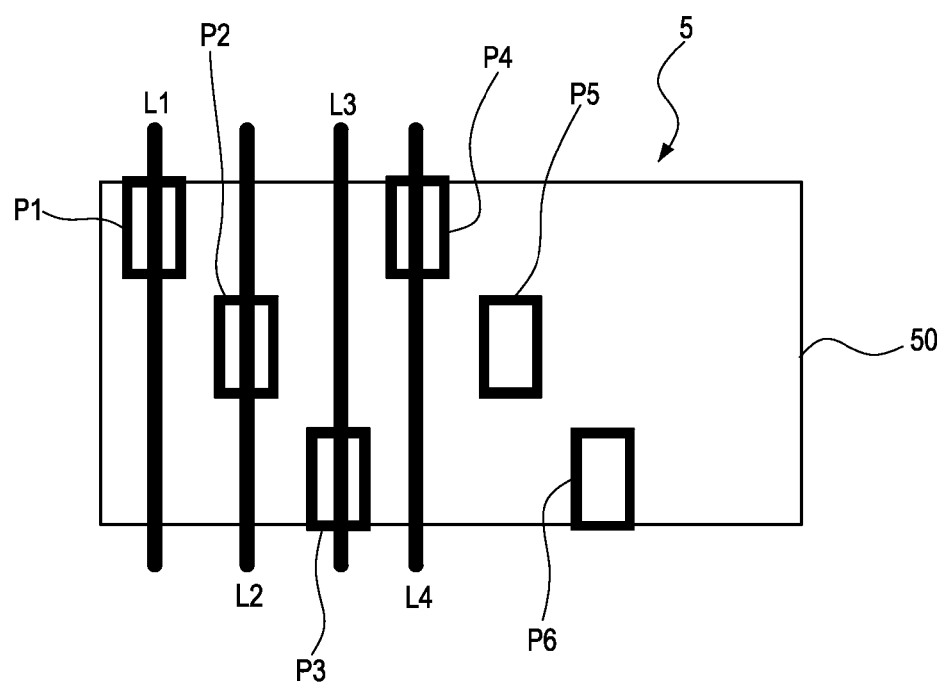
FIG. 6 shows a scheme diagram of another pin ladder interlacing way in the package structure of the invention.

Please refer to FIG. 6. FIG. 6 shows a scheme diagram of another pin ladder interlacing way in the package structure of the invention. As shown in FIG. 6, the pins P3 and P6 of the package structure 5 are disposed at a first side of the substrate 50; the pins P1 and P4 are disposed at a second side opposite to the first side of the substrate 50; the pins P2 and P5 are disposed on a position between the first side and the second side of the substrate 50. It should be noticed that the pins P2 and P5 between the first side and the second side, the pins P3 and P6 at the first side, and the pins P1 and P4 at the second side will be interlaced to each other respectively.

That is to say, the center pin P2 is opposite to the spacing between the pin P3 at the first side and the pin P1 at the second side; the pin P3 at the first side is opposite to the spacing between the pins P2 and P4, and so on. Therefore, a straight line along a specific direction (namely the direction vertical to the two sides of the pin disposed on the substrate 50, but not limited to this) will only pass one of the pins P1~P6 at most. That is to say, among the pins P1~P6, no any two pins will be disposed at the same straight line along the specific direction.

As shown in FIG. 6, the routing L1 of the printed circuit board is coupled to the pin P1 at the second side of the substrate 50; the routing L2 is coupled to the pin P2 at the center of the substrate 50; the routing L3 is coupled to the pin P3 at the first side of the substrate 50; the routing L4 is coupled to the pin P4 at the second side of the substrate 50, and so on.

Figure 7:
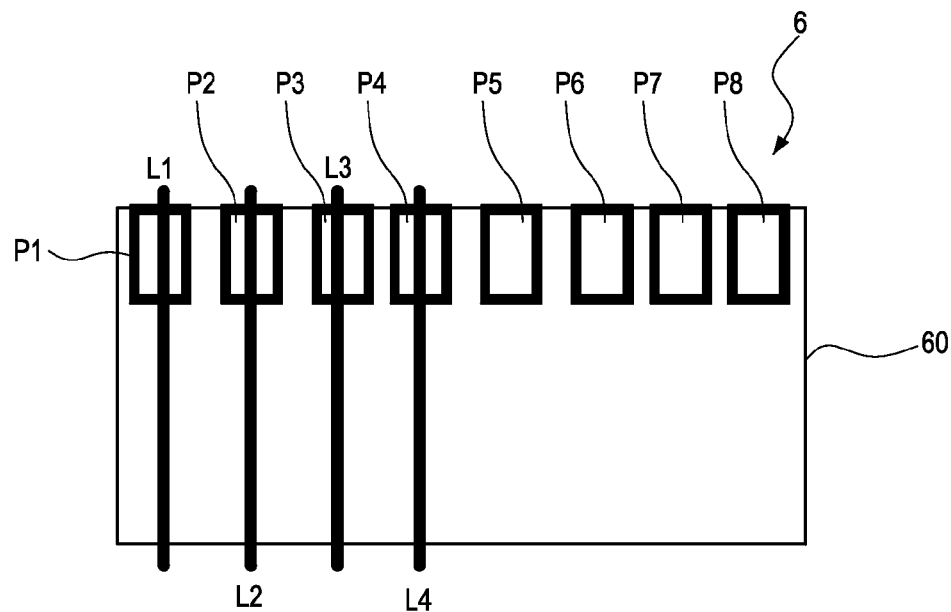
FIG. 7 shows a scheme diagram of another pin one side interlacing way in the package structure of the invention.

Please refer to FIG. 7. FIG. 7 shows a scheme diagram of another pin one side interlacing way in the package structure of the invention. As shown in FIG. 7, all pins P1~P8 of the package structure 6 are disposed at the same side of the substrate 60, and the routings L1~L4 of the printed circuit board are coupled to the pins P1~P4 respectively, and so on. Obviously, a straight line along a specific direction (namely the direction vertical to the two sides of the pin disposed on the substrate 60, but not limited to this) will only pass one of the pins P1~P8 at most. That is to say, among the pins P1~P8, no any two pins will be disposed at the same straight line along the specific direction.

Figure 8:
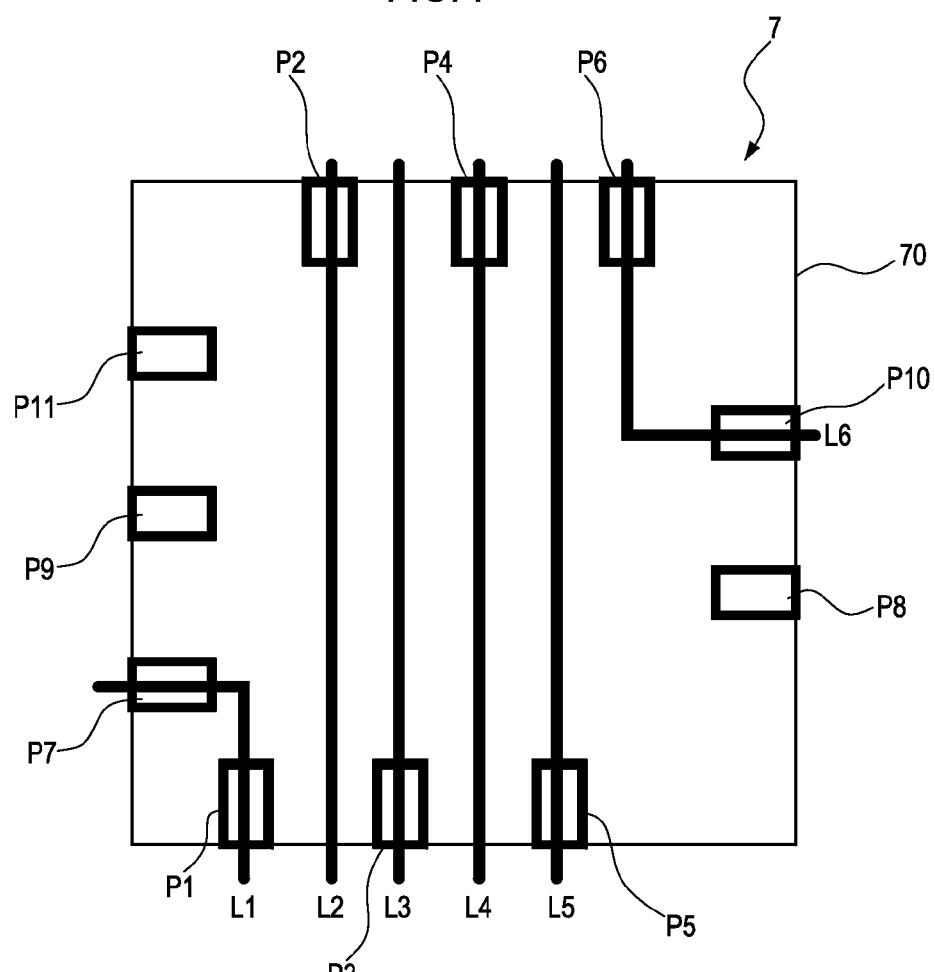
FIG. 8 shows a scheme diagram of another pin interlacing way in the package structure of the invention.

Please refer to FIG. 8. FIG. 8 shows a scheme diagram of another pin interlacing way in the package structure 7 of the invention. As shown in FIG. 8, the quad flat non-leaded (QFN) package is used in the package structure 7. As shown in FIG. 8, the pins P1, P3, and P5 of the package structure 7 are disposed at a first side of the substrate 70; the pins P2, P4, and P6 are disposed at a second side opposite to the first side of the substrate 70. The pins P1, P3, and P5 at the first side and the pins P2, P4, and P6 at the second side are interlaced to each other.

Similarly, the pins P7, P9, and P11 are disposed at a third side different from the first side and the second side of the substrate 70; the pins P8 and P10 are disposed at a fourth side opposite to the third side of the substrate 70. The pins P7, P9, and P11 at the third side and the pins P8 and P10 at the fourth side are interlaced to each other.

As shown in FIG. 8, the routings L3 and L5 of the printed circuit board are coupled to the pins P3 and P5 at the first side respectively; the routings L2 and L4 are coupled to the pins P2 and P4 at the second side respectively. Since the pins P3 and P5 and the pins P2 and P4 are interlaced to each other, therefore, the routings L2~L5 can directly penetrate the bottom of the printed circuit board and the routings L2~L5 is not necessary to be bended. The routing L1 is coupled to the pins P1 and P7 at the two adjacent sides respectively; the routing L6 is coupled to the pins P6 and P10 at the two adjacent sides respectively.

A second embodiment according to the invention is an electronic apparatus. In this embodiment, the electronic apparatus includes a package structure. The package structure includes a substrate and a plurality of pins. The plurality of pins is disposed on the substrate. The plurality of pins is interlaced to each other, so that a line along a specific direction will only pass one of the plurality of pins at most.

In practical applications, the plurality of pins can further include a plurality of first pins and a plurality of second pins. The plurality of first pins and the plurality of second pins are disposed at a first side and a second side of the substrate respectively. The plurality of first pins and the plurality of second pins are interlaced to each other.

In addition, the plurality of pins can further include a plurality of third pins, the plurality of third pins is disposed between the first side and the second side of the substrate, and the plurality of third pins, the plurality of first pins, and the plurality of second pins are also interlaced to each other. Or, the plurality of pins can further include a plurality of fourth pins and a plurality of fifth pins. The plurality of fourth pins and the plurality of fifth pins are disposed at a third side and a fourth side of the substrate respectively. The plurality of fourth pins and the plurality of fifth pins are also interlaced to each other. Wherein, the first side of the substrate is opposite to the second side, and the third side is opposite to the fourth side. As to the detailed description and figures of this embodiment, please refer to the above-mentioned first embodiment, it is not mentioned again here.

Above all, a package structure having interlaced pins and an electronic apparatus including the package structure of the invention can increase the minimum spacing between the adjacent pins in the package structure to lower the difficulty of the package process. In addition, since the routing of the printed circuit board can directly penetrate the bottom of the package structure, therefore, the design of the printed circuit board will become simpler and easier. It should be noticed that the package structure and the electronic apparatus including the package structure of the invention can provide obvious improvement to the circuits sensitive to loads or layout (e.g., a high-speed signal circuit).

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A package structure, comprising:
a substrate, comprising a side and an another side being opposite to the side; and
a plurality of pins, disposed on the substrate, the plurality of pins being interlaced to each other, so that a line along a specific direction only passing one of the plurality of pins at most;
wherein a routing is coupled to one of the plurality of pins and passes from the side to the another side by a straight line way, the plurality of pins comprises a plurality of first pins and a plurality of second pins, the plurality of first pins and the plurality of second pins are disposed at a first side and a second side of the substrate respectively, the first side is the side, the second side is the another side, the plurality of first pins and the plurality of second pins are interlaced to each other, the plurality of pins further comprises a plurality of third pins, the plurality of third pins is disposed between the first side and the second side of the substrate, and the plurality of third pins, the plurality of first pins, and the plurality of second pins are also interlaced to each other.

2. The package structure of claim 1, wherein the plurality of pins further comprises a plurality of fourth pins and a plurality of fifth pins, the plurality of fourth pins and the plurality of fifth pins are disposed at a third side and a fourth side of the substrate respectively, the third side and the fourth side are different from the first side and the second side, the plurality of fourth pins and the plurality of fifth pins are also interlaced to each other.

3. The package structure of claim 2, wherein the third side of the substrate is opposite to the fourth side of the substrate.

4. An electronic apparatus, comprising:
a package structure, comprising:
a substrate, comprising a side and an another side being opposite to the side; and
a plurality of pins, disposed on the substrate, the plurality of pins being interlaced to each other, so that a line along a specific direction only passing one of the plurality of pins at most;
wherein a routing is coupled to one of the plurality of pins and passes from the side to the another side by a straight line way, the plurality of pins comprises a plurality of first pins and a plurality of second pins, the plurality of first pins and the plurality of second pins are disposed at a first side and a second side of the substrate respectively, the first side is the side, the second side is the another side, the plurality of first pins and the plurality of second pins are interlaced to each other, the plurality of pins further comprises a plurality of third pins, the plurality of third pins is disposed between the first side and the second side of the substrate, and the plurality of third pins, the plurality of first pins, and the plurality of second pins are also interlaced to each other.

5. The electronic apparatus of claim 4, wherein the plurality of pins further comprises a plurality of fourth pins and a plurality of fifth pins, the plurality of fourth pins and the plurality of fifth pins are disposed at a third side and a fourth side of the substrate respectively, the third side and the fourth side are different from the first side and the second side, the plurality of fourth pins and the plurality of fifth pins are also interlaced to each other.

6. The electronic apparatus of claim 5, wherein the third side of the substrate is opposite to the fourth side of the substrate.

7. A package structure, comprising:
a substrate, comprising a side and an another side being opposite to the side; and
a plurality of pins, disposed on the substrate, the plurality of pins being interlaced to each other, so that a line along a specific direction only passing one of the plurality of pins at most;
wherein a routing is coupled to one of the plurality of pins and passes from the side to the another side by a straight line way, the plurality of pins comprises a plurality of first pins and a plurality of second pins, the plurality of first pins and the plurality of second pins are disposed at a first side and a second side of the substrate respectively, the first side is the side, the second side is the another side, the plurality of first pins and the plurality of second pins are interlaced to each other, the plurality of pins further comprises a plurality of fourth pins and a plurality of fifth pins, the plurality of fourth pins and the plurality of fifth pins are disposed at a third side and a fourth side of the substrate respectively, the third side and the fourth side are different from the first side and the second side of the substrate, the plurality of fourth pins and the plurality of fifth pins are also interlaced to each other.

* * * * *